US008776601B2

(12) United States Patent
Horning et al.

(10) Patent No.: US 8,776,601 B2
(45) Date of Patent: *Jul. 15, 2014

(54) MEMS SENSOR USING MULTI-LAYER MOVABLE COMBS

(75) Inventors: Robert D. Horning, Savage, MN (US); Ryan Supino, Loretto, MN (US)

(73) Assignee: Honeywell International Inc., Morristown, NJ (US)

( * ) Notice: Subject to any disclaimer, the term of this patent is extended or adjusted under 35 U.S.C. 154(b) by 281 days.

This patent is subject to a terminal disclaimer.

(21) Appl. No.: 13/301,145

(22) Filed: Nov. 21, 2011

(65) Prior Publication Data

US 2012/0126881 A1  May 24, 2012

Related U.S. Application Data

(60) Provisional application No. 61/416,485, filed on Nov. 23, 2010.

(51) Int. Cl.
  *G01P 15/125* (2006.01)
  *G01C 19/56* (2012.01)

(52) U.S. Cl.
  USPC ............ 73/514.32; 73/514.18; 73/504.14

(58) Field of Classification Search
  USPC ............ 73/514.17, 514.18, 514.32, 514.38, 73/504.12, 504.14, 504.04
  See application file for complete search history.

(56) References Cited

U.S. PATENT DOCUMENTS

| | | | |
|---|---|---|---|
| 5,497,660 A * | 3/1996 | Warren | 73/514.18 |
| 5,892,153 A | 4/1999 | Weinberg et al. | |
| 5,914,553 A * | 6/1999 | Adams et al. | 310/309 |
| 5,952,574 A | 9/1999 | Weinberg et al. | |
| 5,969,848 A | 10/1999 | Lee et al. | |
| 5,986,381 A | 11/1999 | Hoen et al. | |
| 6,000,280 A | 12/1999 | Miller et al. | |
| 6,181,050 B1 | 1/2001 | Taussig et al. | |
| 6,481,284 B2 | 11/2002 | Geen et al. | |
| 6,612,029 B2 | 9/2003 | Behin et al. | |
| 6,744,173 B2 | 6/2004 | Behin et al. | |
| 6,744,174 B2 | 6/2004 | Paden et al. | |
| 6,757,092 B2 * | 6/2004 | Abu-Ageel | 359/290 |

(Continued)

OTHER PUBLICATIONS

Tang et al., "Electrostatically Balanced Comb Drive for Controlled Levitation", "Solid-State Sensor and Actuator Workshop 4th Technical Digest", Jun. 1990, pp. 23-27, Publisher: IEEE.

(Continued)

*Primary Examiner* — Helen Kwok
(74) *Attorney, Agent, or Firm* — Fogg & Powers LLC (57) ABSTRACT

A MEMS sensor comprises a substrate and at least one proof mass having a first plurality of combs, wherein the proof mass is coupled to the substrate via one or more suspension beams such that the proof mass and the first plurality of combs are movable. The MEMS sensor also comprises at least one fixed anchor having a second plurality of combs. The first plurality of combs is interleaved with the second plurality of combs. Each of the combs in the first plurality of combs and the second plurality of combs comprises a plurality of conductive layers electrically isolated from each other by one or more non-conductive layers. Each conductive layer is individually coupled to a respective electric potential such that fringing electric fields are screened to reduce motion of the first plurality of combs along a sense axis due to the fringing electric fields.

20 Claims, 5 Drawing Sheets

(56) References Cited

U.S. PATENT DOCUMENTS

| | | | |
|---|---|---|---|
| 6,792,804 B2* | 9/2004 | Adams et al. | 73/514.32 |
| 6,845,668 B2 | 1/2005 | Kim et al. | |
| 6,865,944 B2 | 3/2005 | Glenn et al. | |
| 6,868,726 B2* | 3/2005 | Lemkin et al. | 73/514.32 |
| 7,036,373 B2 | 5/2006 | Johnson et al. | |
| 7,258,010 B2* | 8/2007 | Horning et al. | 73/514.32 |
| 7,357,874 B2 | 4/2008 | Moffat et al. | |
| 7,444,868 B2 | 11/2008 | Johnson | |
| 7,469,588 B2 | 12/2008 | LaFond et al. | |
| 7,504,757 B2 | 3/2009 | Subramanian et al. | |
| 7,690,254 B2 | 4/2010 | Pilchowski et al. | |
| 7,849,742 B2 | 12/2010 | Wang et al. | |
| 7,872,394 B1 | 1/2011 | Gritters et al. | |
| 7,984,648 B2 | 7/2011 | Horning et al. | |
| 8,011,247 B2 | 9/2011 | Glenn | |
| 8,187,902 B2* | 5/2012 | Weinberg et al. | 438/50 |
| 8,549,922 B2* | 10/2013 | Kalnitsky et al. | 73/514.32 |
| 2003/0106372 A1* | 6/2003 | Adams et al. | 73/514.32 |
| 2003/0183008 A1* | 10/2003 | Bang et al. | 73/514.01 |
| 2005/0284222 A1 | 12/2005 | Johnson et al. | |
| 2012/0130672 A1* | 5/2012 | Horning et al. | 702/141 |

OTHER PUBLICATIONS

Timpe et al., "Levitation compensation method for dynamic electrostatic comb-drive actuators", "Science Direct Sensors and Actuators A.", Feb. 7, 2008, pp. 383-389, No. 143, Publisher: Elsevier.

Molfese et al, "Analysis, testing and optimisation of electrostatic comb-drive levitational actuators", "Analog Integr Circ Sig Process", Dec. 22, 2005, pp. 33-40, No. 48, Publisher: Springer Science + Business Media, LLC, Published in: Pisa, Italy.

Painter et al, "Effect of Levitation Forces on the Performance of Surface Micromachined MEMS Gyroscopes", Oct. 24, 2004, pp. 508-511, vol. 1, Publisher: IEEE.

Tang et al, "Electrostatic Comb Drive Levitation and Control Method", "Journal of Microelectromechanical Systems", Dec. 1992, pp. 170-178, vol. 1, No. 4, Publisher: IEEE.

\* cited by examiner

MEMS SENSOR USING MULTI-LAYER MOVABLE COMBS

CROSS-REFERENCE TO RELATED APPLICATIONS

This application claims the benefit of priority to U.S. Provisional Application No. 61/416,485, filed on Nov. 23, 2010, the disclosure of which is incorporated herein by reference.

BACKGROUND

A vibratory Micro-electro-mechanical system (MEMS) gyroscope typically consists of two proof masses vibrating along a line (the drive axis) in a plane. Rotation of the device around an axis perpendicular to the drive axis creates a Coriolis Force vibration in a direction (the sense axis) perpendicular to both the drive and rotation axes. The sense axis vibration amplitude is proportional to the rotation rate. In addition, there are often second-order effects which result in bias and scale factor errors. One of these error mechanisms is referred to as drive induced bias which results from electric fringing fields in near drive or pickoff combs.

SUMMARY

In one embodiment, a Micro-electro-mechanical system (MEMS) sensor is provided. The MEMS sensor comprises a substrate and at least one proof mass having a first plurality of combs, wherein the proof mass is coupled to the substrate via one or more suspension beams such that the proof mass and the first plurality of combs are movable. The MEMS sensor also comprises at least one anchor having a second plurality of combs, wherein the anchor is coupled to the substrate such that the anchor and second plurality of combs are fixed in position relative to the substrate. The first plurality of combs is interleaved with the second plurality of combs. Each of the combs in the first plurality of combs and the second plurality of combs comprises a plurality of conductive layers electrically isolated from each other by one or more non-conductive layers. Each conductive layer is individually coupled to a respective electric potential such that fringing electric fields are screened to reduce motion of the first plurality of combs along a sense axis due to the fringing electric fields.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Figure 1:
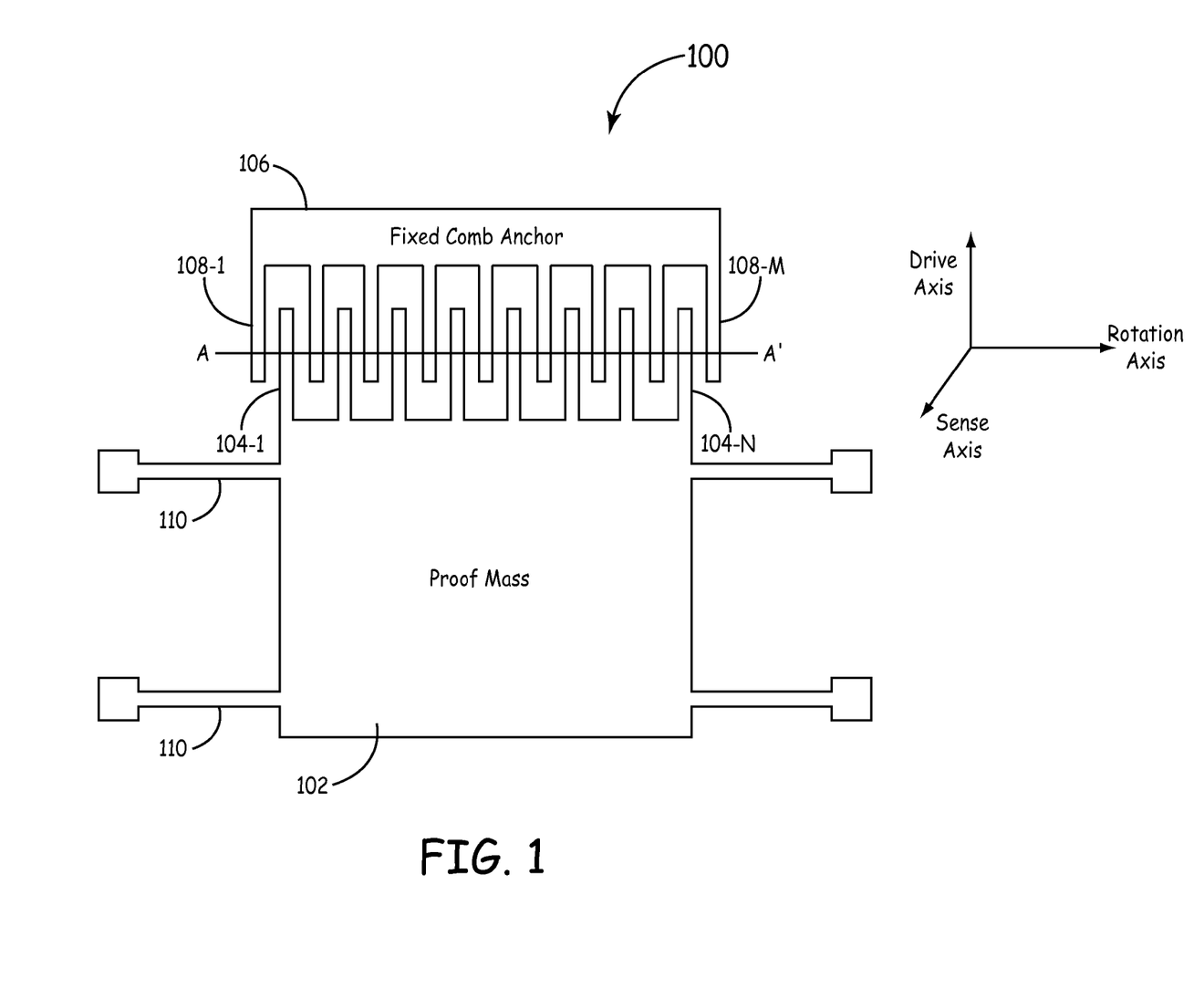
FIG. 1 is a partial top view of one embodiment of an exemplary MEMS sensor.

FIG. 1 is partial top view of one embodiment of an exemplary Micro-electro-mechanical system (MEMS) sensor 100, such as a MEMS gyroscope or a MEMS accelerometer. In particular, FIG. 1 includes a top view of one proof mass 102 in the MEMS sensor 100 for purposes of explanation. However, it is to be understood that the MEMS sensor 100 can include more than one proof mass. The proof mass 102 is suspended by a plurality of suspension beams 110 which permit the proof mass 102 to vibrate. The proof mass 102 also includes a plurality of movable combs or extensions 104-1 . . . 104-N. The movable combs 104-1 . . . 104-N are interdigitated or interleaved with fixed combs 108-1 . . . 108-M of fixed anchor 106. When the proof mass 102 vibrates, the relative position of the movable combs 104-1 . . . 104-N with respect to the fixed combs 108-1 . . . 108-M changes.

For example, in operation, the proof mass 102 vibrates in a plane along the drive axis shown in FIG. 1. Rotation of the sensor 100 around the rotation axis creates a Coriolis Force vibration along the sense axis which is perpendicular to both the drive and rotation axes. In FIG. 1, the sense axis goes into and out of the page. The sense axis vibration amplitude is proportional to the rotation rate. By placing a charge on the movable combs 104-1 . . . 104-N and applying a time varying voltage to the fixed combs 108-1 . . . 108-M, a resultant electric field and electrostatic force capable of driving the proof mass along the drive axis is produced. In this way, the proof mass 102 is driven into vibration along the drive axis.

Figure 2:
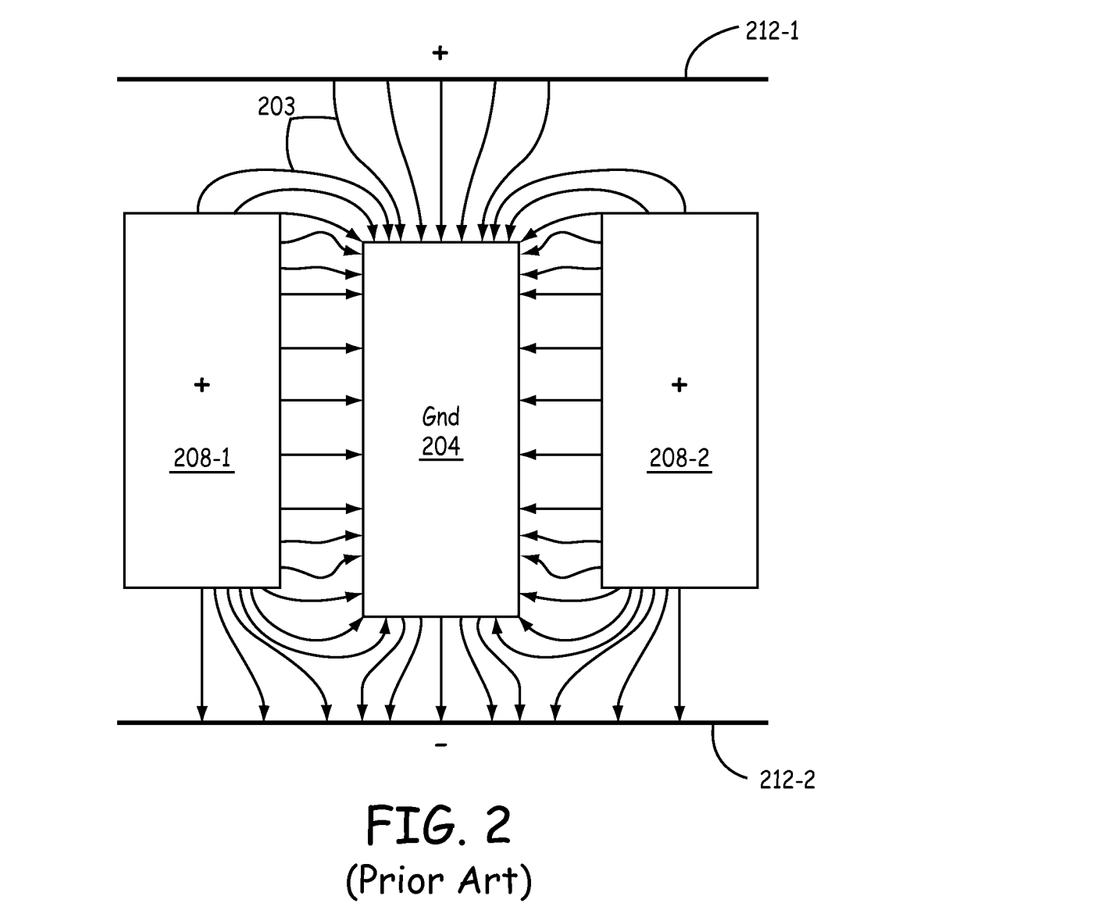
FIG. 2 is a cross sectional view of conventional combs.

In a conventional MEMS sensor applying a time-varying voltage to the fixed combs produces a drive induced force, as depicted in the cross-sectional view of conventional combs 204 and 208 in FIG. 2. The drive induced force is a force along the sense axis due to an imbalance in the electric field on the movable combs 204-1 . . . 204-N as depicted by the field lines 203 in FIG. 2. An electric field extends from the surfaces of fixed combs 208 to the surface of movable combs 204. The field lines 203 represent lines of electric field or lines of electric force. As shown in FIG. 2, most of the field lines 203 are in the plane of the proof mass (i.e. the plane defined by the drive and rotation axes), but some of the field lines 203 are perpendicular to the plane of the proof mass. A conventional MEMS gyroscope also typically includes a charged plate 212-1 above the movable combs 204-1 . . . 204-N and a charged plate 212-2 below the movable combs 204-1 . . . 204-N. In a conventional MEMS gyroscope, the charged plates cause the fringing fields above and below the combs 204-1 . . . 204-N to be imbalanced which results in a force on the movable combs 204-1 . . . 204-N along the sense axis. The force produces a drive induced bias error in the gyroscope. The force can be caused by mismatches in the separation between the combs 204/208 and the plates 212 and offsets in the separation between the fixed combs 208 and the movable combs 204.

Figure 3:
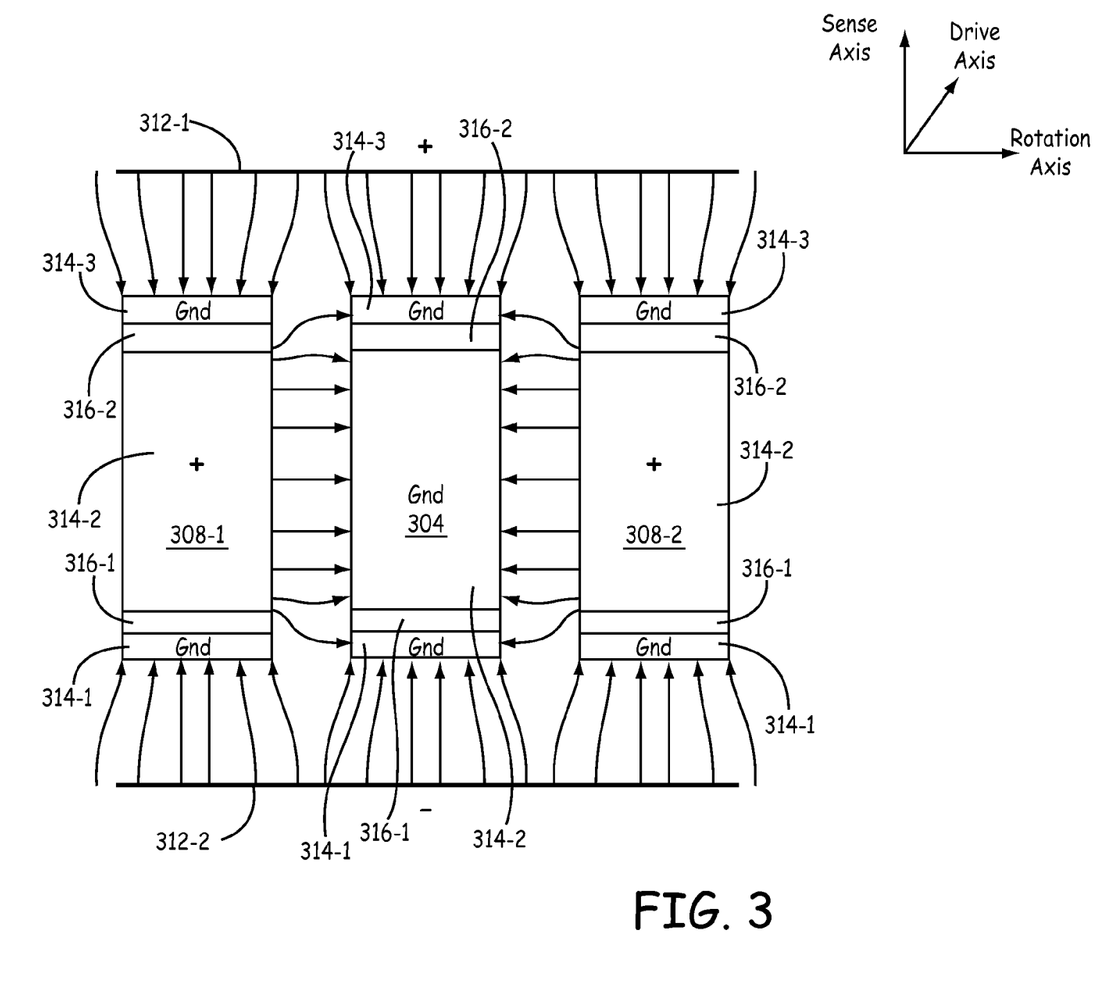
FIG. 3 is a cross-sectional view of one embodiment of combs in an exemplary MEMS sensor.

However, unlike conventional MEMS gyroscopes, the movable combs 104-1 . . . 104-N and fixed combs 108-1 . . . 108-M of MEMS sensor 100 are configured to reduce the out-of-plane fringing forces and the drive induced bias. For example, FIG. 3 depicts a cross-sectional view of one embodiment of exemplary combs 304 and 308 that can be used in MEMS sensor 100. The cross-section is taken across the line A-A' in FIG. 1. As shown in FIG. 3, each of the fixed combs 308 and the movable comb 304 are comprised of a plurality of conductive layers 314 interleaved with a plurality of non-conductive layers 316. Although three conductive layers 314 are depicted in FIG. 3, it is to be understood that, in other embodiments, a different number of conductive layers 314 and corresponding non-conductive layers 316 can be used. The outer conductive layers (layers 314-1 and 314-3 in this example) are also referred to herein as shield layers.

Also shown in FIG. 3 are conductive plates 312-1 and 312-2. Conductive plate 312-1 is located above the combs 304 and 308. Conductive plate 312-2 is located below the combs 304 and 308. In this exemplary embodiment, conductive plate 312-1 carries a net positive charge and conductive plate 312-2 carries a net negative charge. However, it is to be understood that the charge placed on each conductive plate 312 can be different in other embodiments.

In addition, each conductive layer 314 of combs 304 and 308 is individually coupled to an electrical potential (e.g. positive voltage, negative voltage or ground), such as through vias, for example. The non-conductive layers 316 electrically isolate the conductive layers 314 from one another. In the example shown in FIG. 3, the conductive layer 314-3 in each of the combs 304 and 308 is coupled to ground. Similarly, the conductive layer 314-1 in each of the combs 304 and 308 is coupled to ground. The conductive layer 314-2 in combs 308-1 and 308-2 is shown in FIG. 3 coupled to a positive voltage, but it is to be understood that the conductive layer 314-2 can be coupled to a negative voltage or a time-varying voltage in other embodiments. The time varying voltage can be a sinusoidal or other time-varying waveform. In addition, the varying voltage can vary between negative and positive values, between all positive values, or between all negative values. The conductive layer 314-2 in comb 304 is coupled to ground.

By applying voltages to the layers 314 in each of the combs 304 and 308, as described above, the layers 314-1 and 314-3 effectively balance the electric field from the conductive plates 312-1 and 312-2. In other words, fringing field lines between the top conductive plate 312-1 and the combs 304/308 are balanced in the vertical direction (i.e. along the sense axis) with the fringing field lines between the bottom conductive plate 312-2 and the combs 304/308. Hence, the time-varying force created by asymmetry in fringing fields, due to comb offsets or separation mismatches, is reduced or eliminated. Thus, by configuring the combs 304/308 with multiple conductive layers and selectively applying voltages to each layer, the fringing fields are balanced and drive induced bias is reduced.

It is to be understood that the voltages applied to the conductive layers 314 in FIG. 3 are provided by way of example and not by way of limitation. For example, in other embodiments, the shield layers 314-1 and 314-3 are set to the voltages of the upper and lower capacitive plates 312-1/312-2 (that is a positive voltage on the top shield layers 314-3 and negative voltage on the bottom shield layers 314-1 in this example). The configuration of the field lines in such embodiments would appear different from those shown in FIG. 3. However, such embodiments also result in little or no out-of-plane force (e.g. drive induced bias).

Each of the fixed combs and each of the movable combs are formed from a block of silicon in this embodiment. In particular, epitaxial silicon is deposited on a wafer of silicon. The epitaxial silicon is then grown non-homogeneously to produce the conductive layers and the non-conductive layers. For example, as the region which will form the first conductive layer is grown a dopant is applied to the region at high levels which increase the conductive properties of region. In other words, the region is highly or heavily doped. As used herein a highly or heavily doped region means that the ratio of dopant atoms to silicon atoms is high enough that the region is overall electrically conductive. For example, in some embodiments, the ratio of dopant atoms to silicon atoms on the order of, or greater than, one per hundred thousand atoms. In some embodiments, the dopant that is used is boron. However, it is to be understood that other dopants, such as phosphorus or arsenic, can be used in other embodiments.

Once the conductive region has been grown to a desired thickness, the dopant is no longer added so that a non-conductive region is grown. The non-conductive region has either no dopant or is lightly doped. Lightly doped refers to the ratio of dopant atoms to silicon atoms being at a sufficiently low level that the region is overall electrically non-conductive. For example, in some embodiments, the ratio of dopant atoms to silicon atoms is on the order of, or less than, one per 100 million atoms. After growing the non-conductive region, a dopant is again applied to form another heavily doped conductive region. This pattern continues until all the desired conductive and non-conductive regions are formed.

In some embodiments, the conductive regions have a uniform thickness. In other embodiments, some conductive layers are thicker than others. Similarly, in some embodiments, the non-conductive regions are thinner than each of the conductive regions. Each conductive layer can be individually coupled to a voltage source by forming vias as known to one of skill in the art. In addition, in other embodiments, the conductive and non-conductive layers are formed using other processes. For example, an insulating oxide can be applied to a silicon comb and then coated with a metal, polysilicon or other conductive layer.

Figure 4:
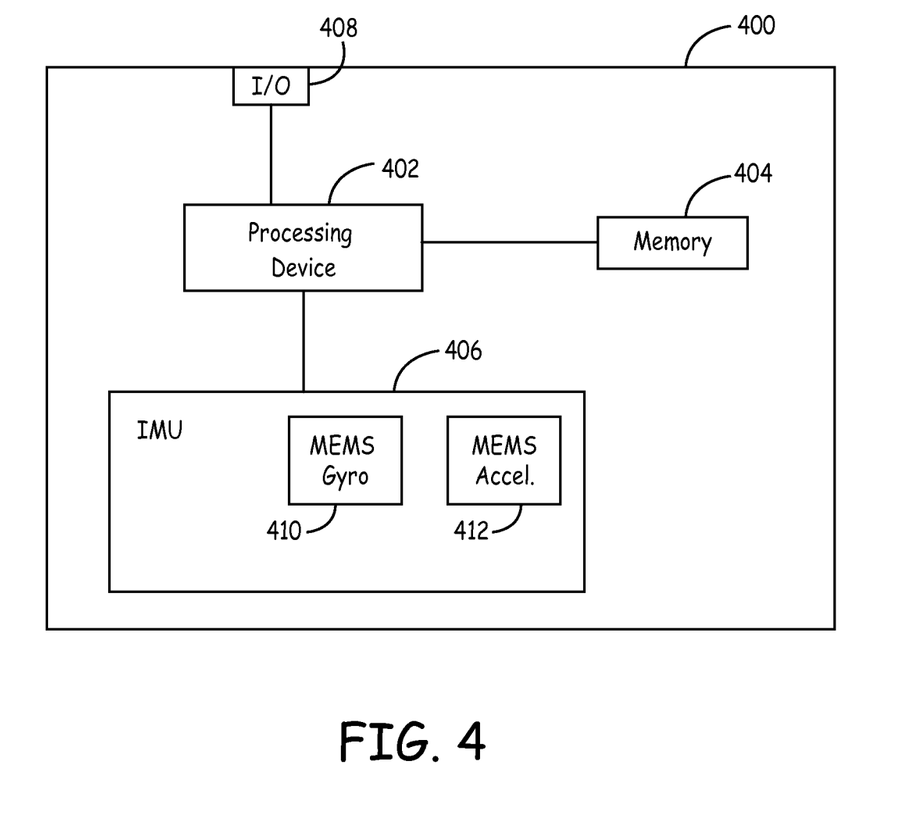
FIG. 4 is a block diagram of one embodiment of a system having a MEMS sensor with multi-layer movable combs.

FIG. 4 is a block diagram of one embodiment of an electronic system 400 including an inertial measurement unit (IMU) 406 having a MEMS sensor configured to reduce drive induced bias. In particular, the IMU 406 in this exemplary embodiment includes a MEMS gyroscope 410 and a MEMS accelerometer 412. Although only one MEMS gyroscope 410 and one MEMS accelerometer 412 is shown in this example, it is to be understood that more than one MEMS gyro and/or more than one MEMS accelerometer can be used in other embodiments. Each of the MEMS gyroscope 410 and MEMS accelerometer 412 are configured to reduce drive induced bias. For example, each of the MEMS gyroscope 410 and MEMS accelerometer 412 includes a plurality of fixed combs interleaved with a plurality of movable combs. Each of the fixed combs and movable combs includes a plurality of conductive layers, as described above. A voltage is individually applied to each conductive layer such that fringing fields about the movable combs are balanced out to reduce drive induced bias.

The electronic system 400 includes one or more processing devices 402 coupled to one or more memory devices 404 and the IMU 406. The IMU 406 provides motion measurements to the one or more processing devices 402. The motion measurements can include measurements of linear and/or angular acceleration. The one or more processing devices 402 process the motion measurements for the intended application. For example, in some embodiments, the electronic device 400 is implemented as an inertial navigation system. In such embodiments, the one or more memory devices 404 include instructions which, when executed by the one or more processing devices 402, cause the one or more processing devices 402 to implement navigation functions such as providing an inertial navigation solution based on the motion measurements. The electronic system 400 can also include an input and/or output port 408 for sending and receiving signals with other devices. For example, the electronic system 400 receives navigation data from a global navigation satellite system (GNSS) which is combined with the motion measurements from the IMU 406 by the one or more processing devices 402 to calculate a combined navigation solution. The electronic system 400 can be integrated into other systems, such as, but not limited to, an aircraft, vehicle, mobile phone, missile, video game controller or other apparatus for which inertial data is desired.

The one or more processing devices 402 can include a central processing unit (CPU), microcontroller, microprocessor (e.g., a digital signal processor (DSP)), field programmable gate array (FPGA), application specific integrated circuit (ASIC) and other processing devices. The one or more memory devices 404 can include tangible media such as magnetic or optical media. For example, tangible media can include a conventional hard disk, compact disk (e.g., read only or re-writable), volatile or non-volatile media such as random access memory (RAM) including, but not limited to, synchronous dynamic random access memory (SDRAM), double data rate (DDR) RAM, RAMBUS dynamic RAM (RDRAM), static RAM (SRAM), etc.), read only memory (ROM), electrically erasable programmable ROM (EEPROM), and flash memory, etc.

Figure 5:
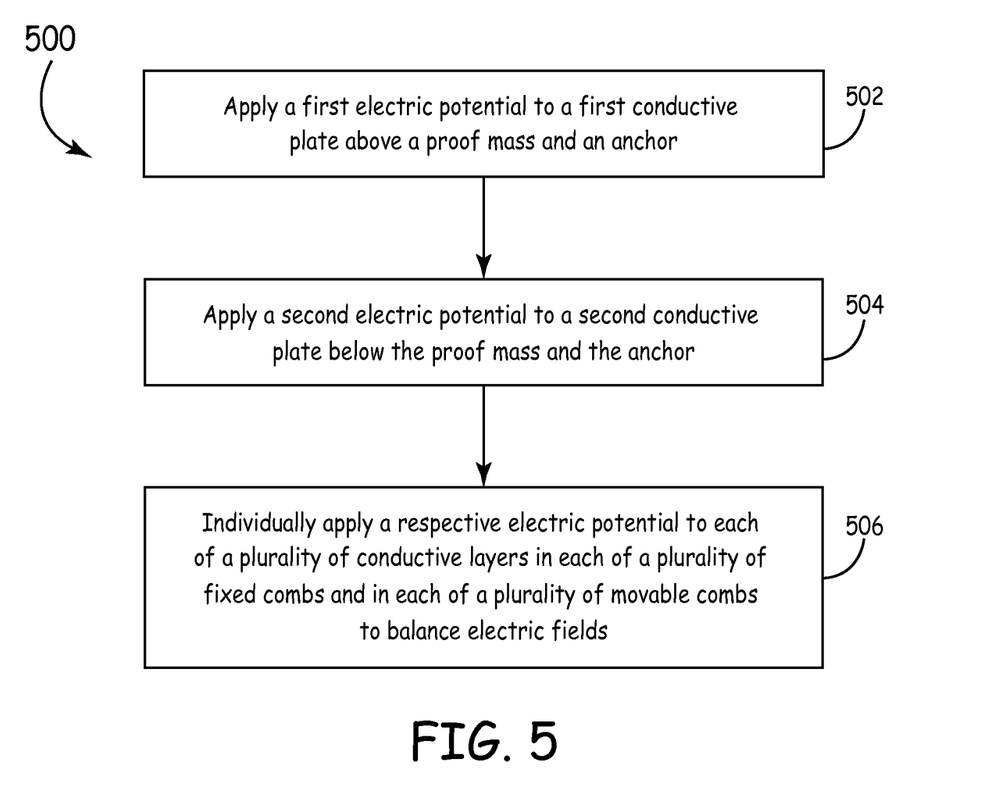
FIG. 5 is a flow chart depicting one embodiment of a method of reducing drive induced bias in a MEMS sensor.

FIG. 5 is a flow chart depicting one embodiment of an exemplary method 500 of reducing out-of-plane forces generated in an electrostatic drive comb. It is to be understood that the order in which the individual acts of method 500 are performed is not to be limited to the order in which they are described herein. Method 500 can be implemented with a MEMS sensor such as sensor 100 above. At block 502, a first electric potential is applied to a first conductive plate above a proof mass. The proof mass has a plurality of movable combs that are interleaved with a plurality of fixed combs of an anchor, each of the plurality of movable combs and the plurality of fixed combs have a plurality of conductive layers separated by one or more non-conductive layers as discussed above.

At block 504, a second electric potential is applied to a second conductive plate below the proof mass and the anchor. At block 506, a respective electric potential is individually applied to each of the plurality of conductive layers in each of the fixed and movable combs. In particular, the respective electric potentials are selected such that outer conductive layers in each comb screen or shield inner conductive layers from the conductive plates such that the change in capacitance between the combs due to displacement along the sense axis is roughly zero. When the change in capacitance due to the displacement along the sense axis is roughly zero, an out-of-plane force along the sense axis is reduced. As used herein, individually applying an electric potential to a conductive layer means that the electric potential applied to the respective layer is not influenced or determined by the electric potential applied to another layer.

In some embodiments, each fixed and movable comb comprises three conductive layers separated from one another by non-conductive layers. Thus, each comb has a first and second outer layer and an inner layer. In some such embodiments, a ground potential is applied to each of the first and second outer layers of each of the fixed and movable combs. A ground potential is also applied to the inner layer of each movable comb and a time-varying potential is applied to the inner layer of each of the fixed combs. In other such embodiments having three conductive layers, the same electric potential applied to the first conductive plate is applied to the outer layer closest to the first conductive plate of each fixed and movable comb. Similarly, the electric potential applied to the second conductive plate is applied to the outer layer closest to the second conductive plate of each fixed and movable comb. A ground potential is applied to the inner layer of each movable comb and a time-varying voltage is applied to the inner layer of each fixed comb. It is to be understood that other patterns of electric potential can be applied in other embodiments.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A Micro-electro-mechanical system (MEMS) sensor, comprising:
    a substrate;
    at least one proof mass having a first plurality of combs, wherein the proof mass is coupled to the substrate via one or more suspension beams such that the proof mass and the first plurality of combs are movable;
    at least one anchor having a second plurality of combs, wherein the anchor is coupled to the substrate such that the anchor and the second plurality of combs are fixed in position relative to the substrate;
    wherein the first plurality of combs is interleaved with the second plurality of combs;
    wherein each of the combs in the first plurality of combs and the second plurality of combs comprises a plurality of conductive layers electrically isolated from each other by one or more non-conductive layers;
    wherein each conductive layer is individually coupled to a respective electric potential such that fringing electric fields are screened to reduce motion of the first plurality of combs along a sense axis due to the fringing electric fields.

2. The MEMS sensor of claim 1, wherein each comb of the first and second plurality of combs comprises a first outer conductive layer, a second outer conductive layer, and an inner conductive layer.

3. The MEMS sensor of claim 2, wherein the first and second outer conductive layers of each comb of the first and second plurality of combs is coupled to ground;
    wherein the inner layer of each comb of the first plurality of combs is coupled to ground and the inner layer of each comb of the second plurality of combs is coupled to a time-varying voltage.

4. The MEMS sensor of claim 1, wherein an outermost layer of each comb of the first and second pluralities of combs is coupled to ground.

5. The MEMS sensor of claim 1, wherein an outermost layer of each comb of the first and second pluralities of combs that is closest to a first conductive plate located above the proof mass is coupled to an electric potential having the same voltage as a voltage applied to the first conductive plate; and
    wherein an outermost layer of each comb of the first and second pluralities of combs that is closest to a second conductive plate located below the proof mass is coupled to an electric potential having the same voltage as a voltage applied to the second conductive plate.

6. The MEMS sensor of claim 1, wherein the combs of the first and second plurality of combs are comprised of silicon, the plurality of conductive layers comprising regions of heavily doped silicon and the one or more non-conductive layers comprising regions of undoped silicon.

7. The MEMS sensor of claim 1, wherein the plurality of conductive layers in each comb do not have a uniform thickness.

8. An electronic system comprising:
an inertial measurement unit comprising one or more micro-electro-mechanical system (MEMS) sensors configured to provide motion measurements; and
a processing unit configured to process the motion measurements received from the inertial measurement unit;
wherein the one or more MEMS sensors each comprise:
a plurality of fixed combs; and
a plurality of movable combs interleaved with the plurality of fixed combs;
wherein each of the plurality of fixed and movable combs comprises a plurality of conductive layers separated by one or more non-conductive layers, each conductive layer configured to be individually coupled to a respective voltage such that electrical fringing fields about the movable combs are balanced by the respective voltage applied to each conductive layer.

9. The electronic system of claim 8, wherein the plurality of conductive layers of each movable and fixed comb in the one or more MEMS sensors comprises:
two conductive shield layers, each shield layer adjacent to an outer surface of the respective comb; and
at least one inner layer.

10. The electronic system of claim 9, wherein the shield layers of each fixed and movable comb in the one or more MEMS sensors are coupled to ground;
wherein the at least one inner layer of the fixed combs is coupled to a time-varying voltage and the at least one inner layer of the movable combs is coupled to ground.

11. The electronic system of claim 9, wherein the at least one inner layer of each comb in the one or more MEMS sensors is thicker than each of the respective shield layers.

12. The electronic system of claim 9, wherein the one or more MEMS sensors further comprise:
a first conductive plate coupled to a first voltage; and
a second conductive plate coupled to a second voltage;
wherein one of the shield layers closest to the first conductive plate in each comb is coupled to the first voltage and the other shield layer in each comb is coupled to the second voltage.

13. The electronic system of claim 8, wherein the fixed and movable combs of the one or more MEMS sensors are comprised of silicon;
wherein the plurality of conductive layers comprise regions of heavily doped silicon and the one or more non-conductive layers comprise regions of lightly doped silicon.

14. The electronic system of claim 8, wherein the one or more non-conductive layers of the fixed and movable combs in the one or more MEMS sensors are thinner than each of the plurality of conductive layers.

15. The electronic system of claim 8, wherein the one or more MEMS sensors are MEMS gyroscopes.

16. A method of reducing out-of-plane forces generated in an electrostatic drive comb, the method comprising:
applying a first electric potential to a first conductive plate above a proof mass having a plurality of movable combs and above an anchor having a plurality of fixed combs interleaved between the plurality of movable combs, each of the plurality of movable combs and the plurality of fixed combs having a plurality of conductive layers separated by one or more non-conductive layers;
applying a second electric potential to a second conductive plate below the proof mass and the anchor;
individually applying a respective electric potential to each of the plurality of conductive layers in each of the plurality of fixed combs and in each of the plurality of movable combs to balance electric fields produced by the first and second conductive plates.

17. The method of claim 16, wherein each of the fixed combs and the movable combs comprises a first outer conductive layer, a second outer conductive layer and an inner layer;
wherein individually applying the respective electric potential comprises:
applying a ground potential to each of the first and second outer conductive layers in each of the fixed and the movable combs;
applying a ground potential to the inner layer of each of the movable combs; and
applying a time-varying electric potential to the inner layer of each of the fixed combs.

18. The method of claim 16, wherein each of the fixed combs and the movable combs comprises a first outer conductive layer, a second outer conductive layer and an inner layer;
wherein individually applying the respective electric potential comprises:
applying the first electric potential to each of the first outer conductive layers in each of the fixed and the movable combs;
applying the second electric potential to each of the second outer conductive layers in each of the fixed and the movable combs
applying a ground potential to the inner layer of each of the movable combs; and
applying a time-varying electric potential to the inner layer of each of the fixed combs.

19. The method of claim 16, wherein each of the fixed combs and each of the movable combs are comprised of silicon, the plurality of conductive layers in each respective comb comprising regions of heavily doped silicon and the one or more non-conductive layers comprising regions of undoped silicon.

20. The method of claim 16, wherein the conductive layers of each respective comb do not have a uniform size.

* * * * *